(12) United States Patent
Jafarian-Tehrani et al.

(10) Patent No.: US 8,315,029 B2
(45) Date of Patent: *Nov. 20, 2012

(54) ESC HIGH VOLTAGE CONTROL AND METHODS THEREOF

(75) Inventors: Seyed Jafar Jafarian-Tehrani, Fremont, CA (US); Ralph Jan-Pin Lu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/185,339

(22) Filed: Jul. 18, 2011

(65) Prior Publication Data

US 2012/0018095 A1     Jan. 26, 2012

Related U.S. Application Data

(63) Continuation of application No. 12/848,970, filed on Aug. 2, 2010, now Pat. No. 7,983,018.

(51) Int. Cl.
*H01L 21/683* (2006.01)
*H01T 23/00* (2006.01)

(52) U.S. Cl. ........................................ 361/234
(58) Field of Classification Search ............... 361/234
See application file for complete search history.

(56) References Cited

U.S. PATENT DOCUMENTS

| | | | |
|---|---|---|---|
| 5,103,367 A | 4/1992 | Howitz et al. | |
| 6,518,195 B1 | 2/2003 | Collins et al. | |
| 6,563,076 B1 | 5/2003 | Benjamin et al. | |
| 7,166,233 B2 | 1/2007 | Johnson et al. | |
| 7,169,255 B2 | 1/2007 | Yasui et al. | |
| 7,768,766 B2 * | 8/2010 | Jafarian-Tehrani et al. | .. 361/234 |
| 7,983,018 B2 * | 7/2011 | Jafarian-Tehrani et al. | .. 361/234 |
| 2005/0225923 A1 | 10/2005 | Howald | |
| 2006/0221540 A1 | 10/2006 | Himori et al. | |
| 2008/0144251 A1 | 6/2008 | Tao | |
| 2008/0218931 A1 | 9/2008 | Hsu et al. | |

OTHER PUBLICATIONS

"International Search Report", PCT Application No. PCT/US2008/065369, Mailing Date: Sep. 30, 2008.
"Written Opinion", PCT Application No. PCT/US2008/065369, Mailing Date: Sep. 30, 2008.
"International Preliminary Report on Patentability", PCT Application No. PCT/US2008/065369, Mailing Date: Dec. 10, 2009.
"Non Final Office Action", U.S. Appl. No. 12/848,970, Mailing Date: Dec. 27, 2010.
"Notice of Allowance and Fees Due", U.S. Appl. No. 11/770,606, Mailing Date: Mar. 25, 2010.

* cited by examiner

*Primary Examiner* — Dharti Patel
(74) *Attorney, Agent, or Firm* — IPSG, P.C. Intellectual Property Law

(57) ABSTRACT

A plasma processing system for processing a wafer is provided. The system includes an electrostatic chuck (ESC) positioned inside a plasma processing chamber and configured to support the wafer. The ESC includes a positive terminal for providing a first force to the wafer and a negative terminal for providing a second force to the wafer. The system also includes a first circuit arrangement configured to measure at least a first voltage for determining a value of a positive load current applied to the positive terminal. The system further includes a second circuit arrangement configured to measure at least a second voltage for determining a value of a negative load current applied to the negative terminal. The system yet also includes circuitry configured to adjust a bias voltage using the values of the positive load current and the negative load current for balancing the first force and the second force.

20 Claims, 7 Drawing Sheets

$$V_{ISP} = (VD_1 - VD_2) * (-X) \quad \ldots\ldots\ldots\ldots(241)$$

$$\Delta V = (Y) * (V_{ISP}) + (VD_2) * (R_S / RD_2) \quad \ldots\ldots\ldots\ldots(242)$$

$$I_{LP} = (\Delta V) / (R_S) \quad \ldots\ldots\ldots\ldots(243)$$

Fig. 2C

ESC HIGH VOLTAGE CONTROL AND METHODS THEREOF

PRIORITY CLAIM

This continuation application claims priority under 37 CFR 1.53(b) of and claims the benefit under 35 U.S.C. §120 to a commonly assigned patent application entitled "Plasma Processing System ESC High Voltage Control And Methods Thereof," by Jafarian-Tehrani et al., application Ser. No. 12/848,970 filed on Aug. 2, 2010 now U.S. Pat. No. 7,983,018, which claims priority under 37 CFR 1.53(b) of and claims the benefit under 35 U.S.C. §120 to a commonly assigned patent application entitled "Plasma Processing System ESC High Voltage Control," by Jafarian-Tehrani et al., application Ser. No. 11/770,606 filed on Jun. 28, 2007, which claims priority under 35 USC 119(e) to a commonly-owned provisional application entitled "Plasma Processing System", filed by the same inventors herein on Jun. 1, 2007 (Application No. 60/941,642), all of which are incorporated here by reference.

BACKGROUND OF THE INVENTION

In the semiconductor industry, a plasma processing system may be utilized to perform processing (e.g., etching or deposition) on wafers. In general, a wafer may be secured on an electrostatic chuck (ESC) by electrostatic forces for the processing. In order to ensure the wafer is stable during the processing, the electrostatic forces applied on the wafer by the positive and negative terminals of the ESC may need to be balanced by adjusting power supply. To adjust the power supply, the values of the positive load current supply to the positive terminal and the negative load current supply to the negative terminal may need to be calculated or measured.

FIG. 1A illustrates a schematic representation of an example plasma processing system 160. Plasma processing system 160 may include a chamber 169. Inside the chamber there may be an electrostatic chuck 164 for supporting wafers, such as wafer 162, during processing utilizing plasma 179. Plasma processing system 160 may have a DC power supply 166 to provide the clamping voltage 172 for securing wafer 162 on chuck 164. The DC power supply may be programmable, e.g., utilizing a bias control or sensor input 198 and/or a clamp control 197, for setting a bias voltage 170 that defines a center of the clamping voltage 172, which may be a voltage with two endpoints, e.g., positive high voltage (+HV) 129 and negative high voltage (−HV) 130 (also illustrated in the example of FIG. 1B).

In order to keep the wafer 162 secured, or "clamped", on the electrostatic chuck 164 it may be required to tune bias voltage 170 for a condition such that bias voltage 170 matches a plasma induced bias voltage 194 across chuck 164; plasma induced bias voltage 194 may not be directly measured/adjusted. The required condition may be equivalent to a condition that the value of the positive load current 181 applied to positive terminal 185 is substantially equal to the value of negative load current 182 applied to negative terminal 186. If the values of the load current are substantially different, electrostatic forces supplied by positive terminal 185 and negative terminal 186 may be substantially different, and wafer 162 may be tilted. As a result, the yield of plasma processing may be reduced.

In order to ensure the values of the load currents are substantially equal, the values may need to be measured, sampled and/or calculated.

FIG. 1B illustrates a schematic representation of a prior art arrangement including an isolation amplifier 132 for measuring the value of positive load current 181 illustrated in the example of FIG. 1A. A similar arrangement may be made for measuring the value of negative load current 182 illustrated in the example of FIG. 1A.

In the prior art arrangement, with reference to FIG. 1A-B, DC power supply 166 may supply positive high voltage 129, e.g., with a value of 2000 V, into plasma processing chamber 169 through RF filter 187 and positive terminal 185; RF filter 187 and positive terminal 185 may be represented by an equivalent resistor 107. The arrangement may include a sensing resistance 100 disposed between a first terminal 151 and a second terminal 152, first terminal 151 and second terminal 152 may be disposed between a terminal of DC power supply 166 with positive high voltage (+HV) 129 and equivalent resistor 107.

The arrangement may also include an instrumentation amplifier 102 electrically coupled with first terminal 151 and second terminal 152 through resistor 117 and resistor 118, respectively. Instrumentation 102 may be configured to sense the voltage between first terminal 151 and second terminal 152, i.e., ΔV 171, in order to determine the value of sensing current 103 utilizing the resistance value of sensing resistor 100.

In order for instrumentation amplifier 102 to sense ΔV 171, isolation amplifier 132 may be employed to shift the operating point (or operating range) of instrumentation amplifier 102 up; for example, to a range of about 2000V−15V~about 2000V+15V. Having a high operating point, instrumentation amplifier 102 may be able to sense ΔV 171.

Typical equipment for measuring voltage may only be able to measure voltages in a range of about −15V~about +15V. In order to obtain the value of a high voltage output 116 of instrumentation amplifier 102, isolation amplifier 132 may also be configured to shift output 116 to a low voltage referenced output 134 that is within a range of −15V~+15V relative to ground level 136. Low voltage referenced output 134 may be measured utilizing typical voltage measurement equipment. Subsequently, low voltage referenced output 134 may be utilized to calculate output 116. In turn, output 116 may be utilized to determine the value of ΔV 171, which may be utilized to determine the value of sensing current 103. The value of positive load current 181 may be assumed to be equal to the value of sensing current 103 according to the prior art arrangement.

In general, isolation amplifier 132 may be very expensive. Further, the capability of isolation amplifier 132 may be substantially limited. Typically, isolation amplifier 132 may only be able to shift the operating point of instrumentation amplifier 102 up to about 2.5 kV. The limitation may be insufficient to satisfy requirements of some plasma processing systems, which may have a high voltage input of about 6 kV or even higher.

Instrumentation amplifier 102 also may have limitations. For example, instrumentation amplifier 102 typically may have a sensing range of only from −10V~+10V. Given such limitations, instrumentation amplifier 102 may not be able to satisfy the requirements of some plasma processing systems.

SUMMARY

An embodiment of the invention relates to a plasma processing system. The plasma processing system may include an electrostatic chuck (ESC) positioned inside a plasma processing chamber and configured to support (and clamp) a wafer. The ESC may include a positive terminal (+ESC) for providing a first force to the wafer and a negative terminal (−ESC) for providing a second force to the wafer. The plasma processing system may also include a first trans-impedance amplifier (TIA) and a second TIA configured to measure a first set of voltages for calculating a value of a positive load current applied to the positive terminal. The plasma processing system may also include a third TIA and a fourth TIA configured to measure a second set of voltages for calculating or measuring a value of a negative load current applied to the negative terminal. The plasma processing system may also include logic or a program for adjusting a bias voltage such that the value of the positive load current and the value of the negative load current may have an equal magnitude. The plasma processing system may also include a diagnostic unit configured to determine at least one of a health condition and a remaining life of the ESC based on at least one of the value of the positive load current and the value of the negative load current.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2C illustrates a mathematical manipulation for obtaining the value/amperage of the positive load current.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a plasma processing system. The plasma processing system may include an electrostatic chuck (ESC) positioned inside a plasma processing chamber and configured to support a wafer. The ESC may include a positive terminal (+ESC) for providing a first force to the wafer and a negative terminal (−ESC) for providing a second force to the wafer. The high voltages on a positive terminal (+ESC) and negative terminal (−ESC) may be programmable and controlled.

The plasma processing system may also include a first trans-impedance amplifier (TIA) and a second TIA configured to measure a first set of voltages for calculating a value of a positive load current applied to the positive terminal. The plasma processing system may also include a third TIA and a fourth TIA configured to measure a second set of voltages for calculating a value of a negative load current applied to the negative terminal.

Figure 1A:
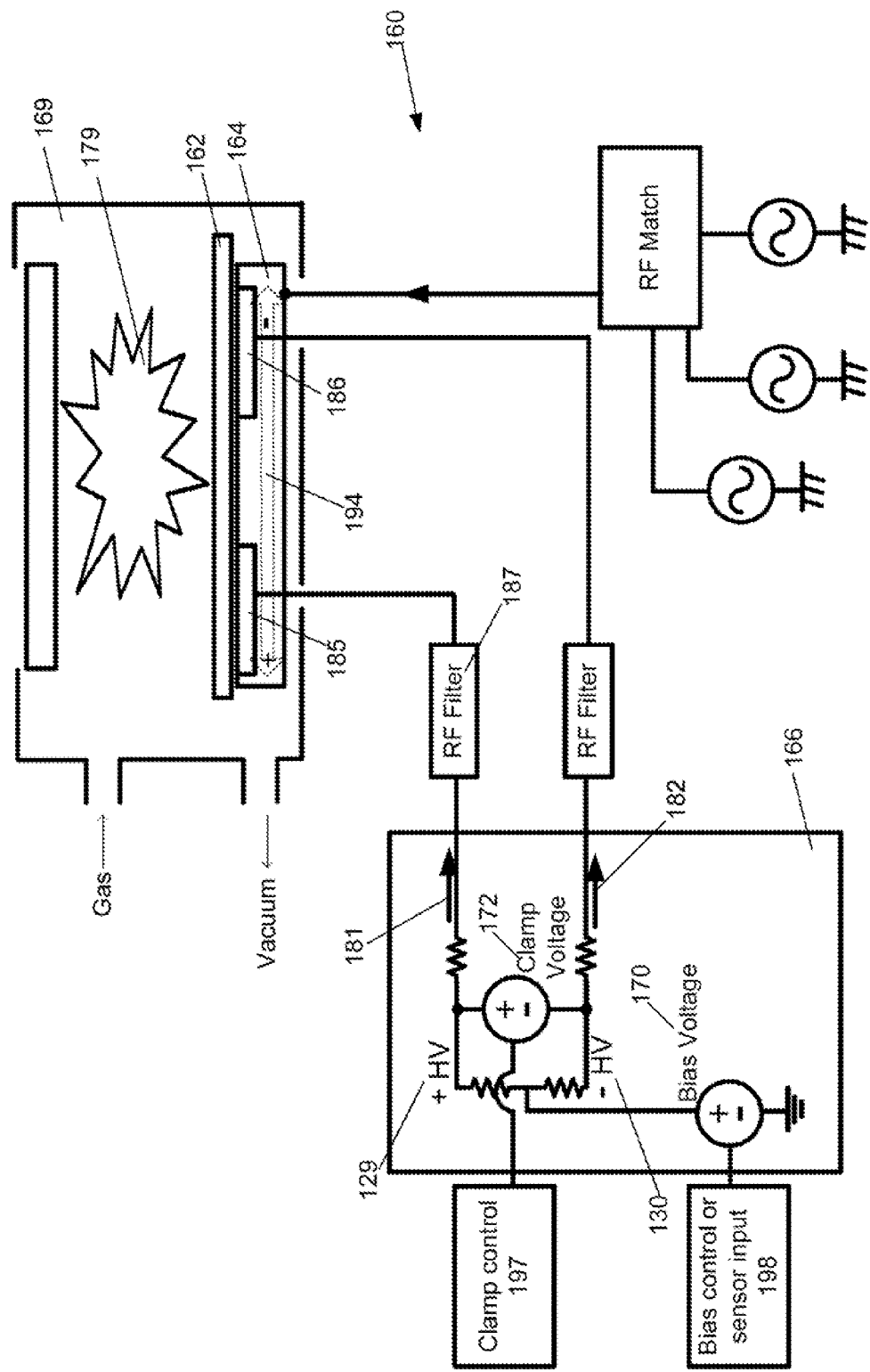
FIG. 1A illustrates a schematic representation of an example plasma processing system.
Figure 1B:
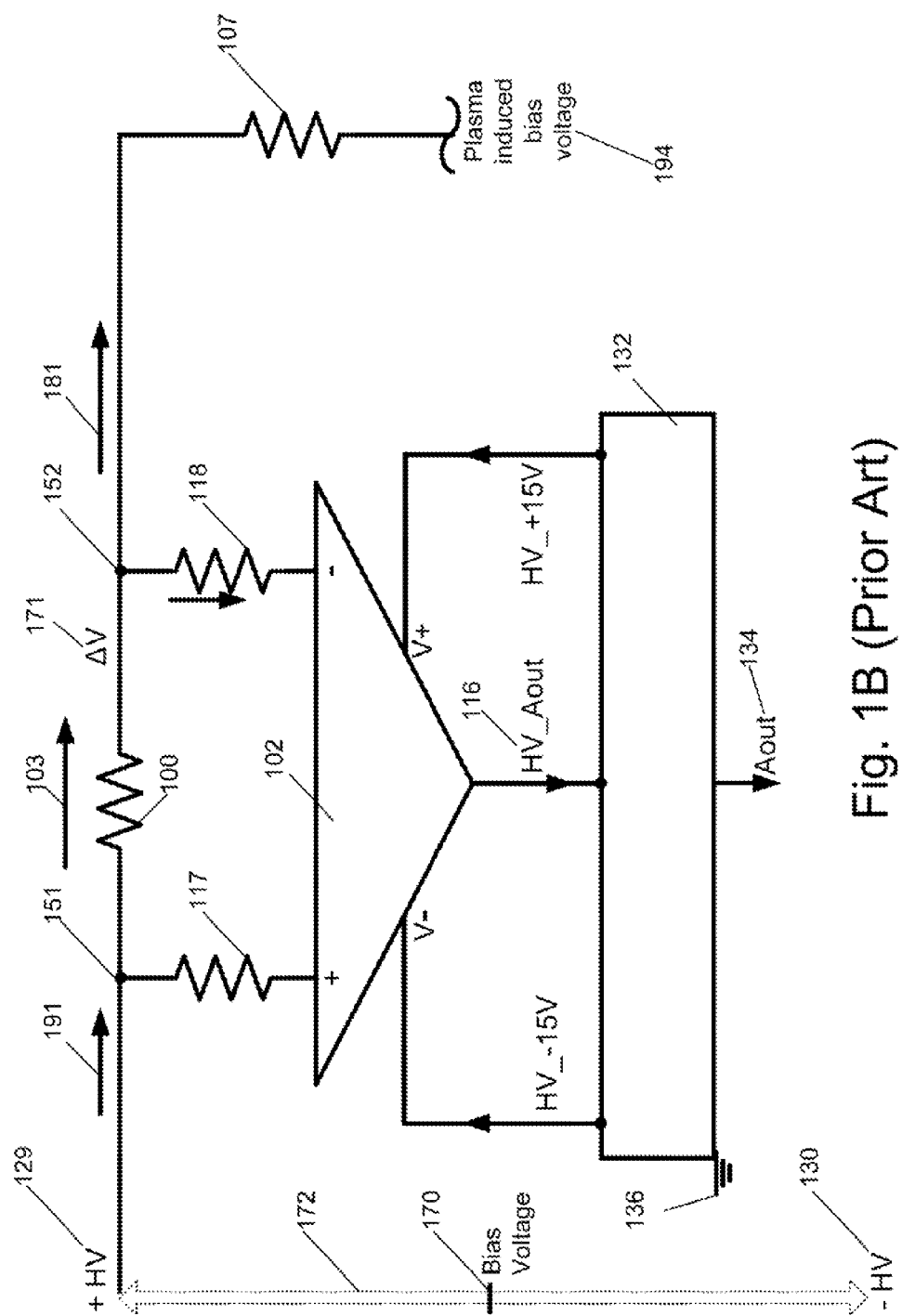
FIG. 1B illustrates a schematic representation of a prior art arrangement including an isolation amplifier for measuring the value of a positive load current in plasma processing system illustrated in the example of FIG. 1A.

The plasma processing system may also include logic or a program (e.g., included in a bias control/sensor input unit similar to bias control or sensor input 198 illustrated in the example of FIG. 1A) for adjusting a bias voltage such that the value of the positive load current and the value of the negative load current may have an equal magnitude or may have an offset that corrects an error of an estimated plasma induced bias voltage. Accordingly, the first force and the second force may be balanced, and the wafer may be secured on the ESC.

The plasma processing system may also include a diagnostic unit (e.g., included in a bias control/sensor input unit similar to bias control or sensor input 198 illustrated in the example of FIG. 1A) configured to determine at least one of a health condition and a remaining life of the ESC based on at least one of the value of the positive load current and the value of the negative load current.

The plasma processing system may also include a control unit. The control unit may be configured to control at least a first ESC voltage at the positive terminal and a second ESC voltage at the negative terminal using at least one of a first voltage measured by the second TIA and a second voltage measured by the fourth TIA. The first ESC voltage may be proportional to the first voltage; the second ESC voltage may be proportional to the second voltage. Accordingly, the high voltages at the positive and negative terminals may follow (or track) programmable input set-points, independent of other process variables or environmental variables.

The first ESC voltage may be positive, and the second ESC voltage may be negative. In one or more embodiments, for example, when the polarities of the positive terminal and the negative terminals are reversed, the first ESC voltage may be negative, and the second ESC voltage may be positive.

The control unit may also be configured to control the difference between the first ESC voltage and the second ESC voltage. The difference may represent a clamp voltage pertaining to clamping forces applied on the wafer.

One or more embodiments of the invention relate to a method for securing a wafer on an electrostatic chuck (ESC) positioned inside a plasma processing chamber. The ESC may include a positive terminal for providing a first force to the wafer and a negative terminal for providing a second force to the wafer. The method may include connecting, using a first component, a first trans-impedance amplifier (TIA) to a first terminal on a first electrical path. The first electrical path may be between a power supply and the positive terminal. The first component may have a first resistance. The method may also include determining, using the first TIA, a first voltage across a second component. The second component may connect two end points of the first TIA and may have a second resistance.

The method may also include connecting, using a third component, a second TIA to a second terminal on the first electrical path. The third component may have a third resistance. The method may also include determining, using the second TIA, a second voltage across a fourth component. The fourth component may connect two end points of the second TIA and may have a fourth resistance.

The method may also include determining a value of a positive load current applied to the positive terminal using one or more of the first voltage, the first resistance, the second resistance, the second voltage, the third resistance, and the fourth resistance. The method may also include determining a value of a negative load current applied to the negative terminal. The method may also include adjusting a bias voltage using the value of the positive load current and the value of the negative load current for balancing the first force and the second force.

The method may also include converting a ratio of the first resistance to the second resistance into a product of at least a first intermediate term and a second intermediate term. The method may also include calculating an intermediate voltage term using the first voltage, the second voltage, and the first intermediate term. The method may also include calculating an inter-terminal voltage between the first terminal and the second terminal using the intermediate voltage term, the second intermediate term, the second voltage, the second resistance, and an inter-terminal resistance between the first terminal and the second terminal.

The step of determining the value of the positive load current may include determining, using the first voltage, the first resistance, and the second resistance, a first terminal voltage at the first terminal. The step of determining the value of the positive load current may also include determining, using the second voltage, the third resistance, and the fourth resistance, a second terminal voltage at the second terminal.

The step of determining the value of the positive load current may also include determining, using the first terminal voltage, the second terminal voltage, and an inter-terminal resistance between the first terminal and the second terminal, a value of an inter-terminal current between the first terminal and the second terminal.

The step of determining the value of the positive load current may also include determining, using the second voltage and the fourth resistance, a value of a terminal-TIA current from the second terminal to the second TIA.

The value of the inter-terminal current value and the value of the terminal-TIA current value may be utilized to determine the value of the positive load current. The value of the negative load current may be determined utilizing steps similar to steps utilized in determining the value of the positive load current.

Two or more ratios of resistances associated with the TIAs may be configured to equal, to simplify implementation. Two or more of the resistances across TIAs also may be configured to be equal for simplifying implementation.

The method may also include controlling at least a first ESC voltage at the positive terminal and a second ESC voltage at the negative terminal using at least one of the second voltage and the fourth voltage. The method may also include control the difference between the first ESC voltage and the second ESC voltage using at least one of the second voltage and the fourth voltage.

The features and advantages of the present invention may be better understood with reference to the figures and discussions that follow.

Figure 2A:
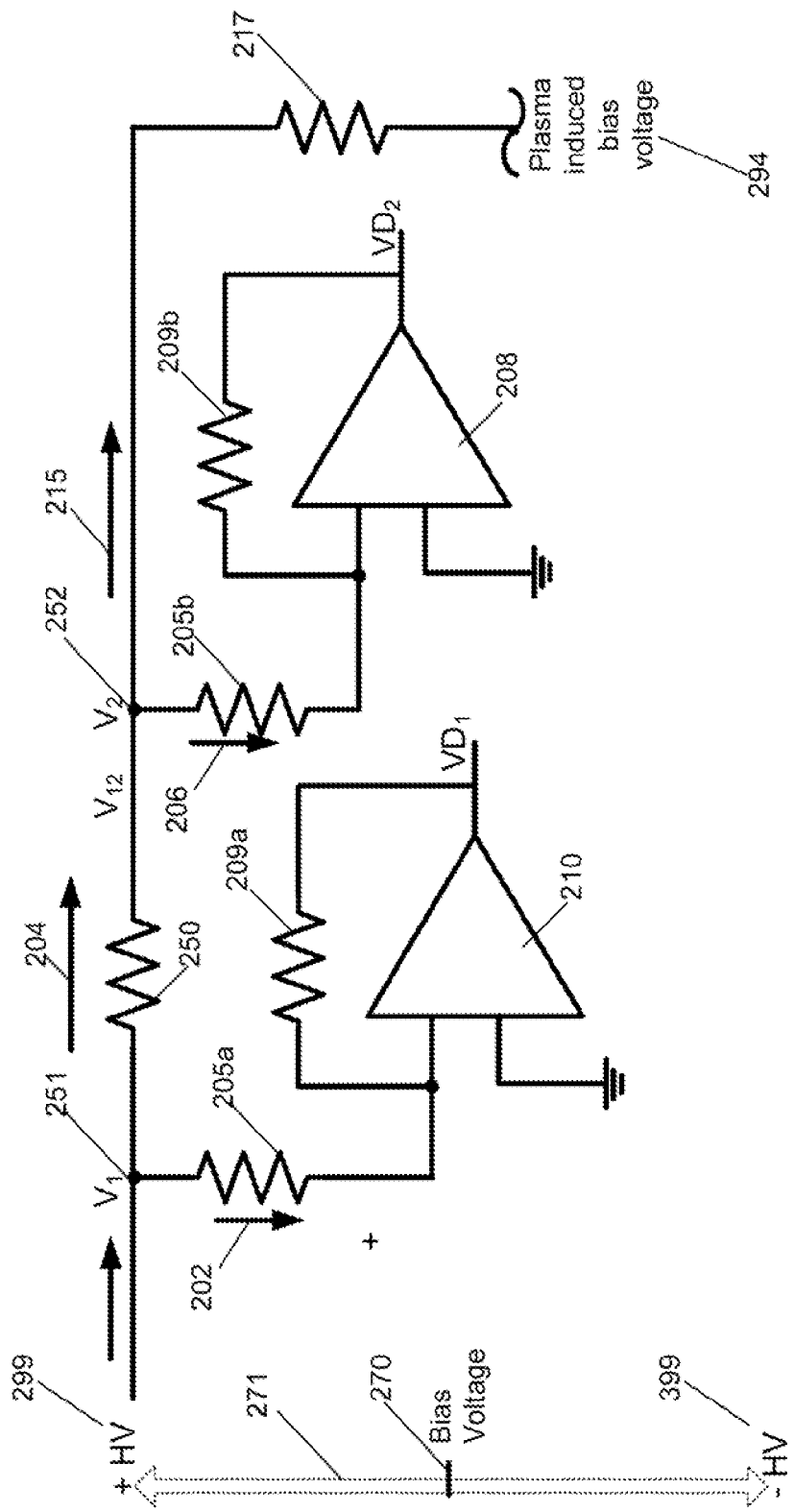
FIG. 2A illustrates a schematic representation of an arrangement for measuring a value/amperage of a positive load current applied to a positive terminal of an electrostatic chuck in a plasma processing system in accordance with one or more embodiments of the invention.

FIG. 2A illustrates a schematic representation of an arrangement for measuring a value/amperage $I_{LP}$ of a positive load current 215 applied to a positive terminal of an electrostatic chuck in a plasma processing system (similar to plasma processing system 160 illustrated in the example of FIG. 1A) in accordance with one or more embodiments of the invention.

The plasma processing system may include a power supply, such as a DC power supply similar to DC power supply 166 illustrated in the example of FIG. 1A. The power supply may be configured to supply a positive high voltage (+HV) 299 to a positive terminal (similar to positive terminal 185 illustrated in the example of FIG. 1A) of an electrostatic chuck (similar to chuck 164 illustrated in the example of FIG. 1A) inside a plasma processing chamber (similar to plasma processing chamber 169 illustrated in the example of FIG. 1A) of the plasma processing system through a RF filter (similar to RF filter 167 illustrated in the example of FIG. 1A). The resistance of the positive terminal and the RF filter may be represented by an equivalent resistor 217.

In one or more embodiments, a clamp voltage 271, i.e., the difference between positive high voltage (+I-IV) 299 and a corresponding negative high voltage (−HV) 399 (also illustrated in the example of FIG. 3) supplied by the power supply may be in excess of 6 kV. For example, positive high voltage (+HV) 299 may be about +4.5 kV, and the corresponding negative high voltage (−HV) 399 may be about −1.5 kV. In another example, positive high voltage (+HV) 299 may be about +1.5 kV, and the corresponding negative high voltage (−HV) 399 may be about −4.5 kV. A bias voltage 270, a center point of clamp voltage 271 (between positive high voltage (+HV) 299 and negative high voltage (−HV) 399), may be tuned to match a plasma induced bias voltage 294.

The plasma processing system may also include a first trans-impedance amplifier 210 (TIA 210) electrically connected to a first terminal 251 positioned on the electrical path (or power supply path) between the power supply and the positive terminal. First TIA 210 may be coupled with first terminal 251 through a first component/resistor 205a with a first resistance value $RD_1$. A second component/resistor 209a with a second resistance value $RD_2$ may be implemented across two ends of first TIA 210. The ratio of $RD_1$ to $RD_2$ may be chosen for simplifying measurement of positive load current 215. As an example, the ratio of $RD_1$ to $RD_2$ may be configured to be 600.

The plasma processing system may also include a second TIA 208 electrically connected to a second terminal 252 on the power supply path through a third component/resistor 205b also with the first resistance value $RD_1$. In one or more embodiments, third component/resistor 205b may have a different resistance value (other than $RD_1$). A fourth component/resistor 209b also with the second resistance value $RD$, may be implemented across two endpoints of TIA 208. In one or more embodiments, fourth component/resistor 209b may have a different resistance value (other than $RD_2$).

Figure 2B:
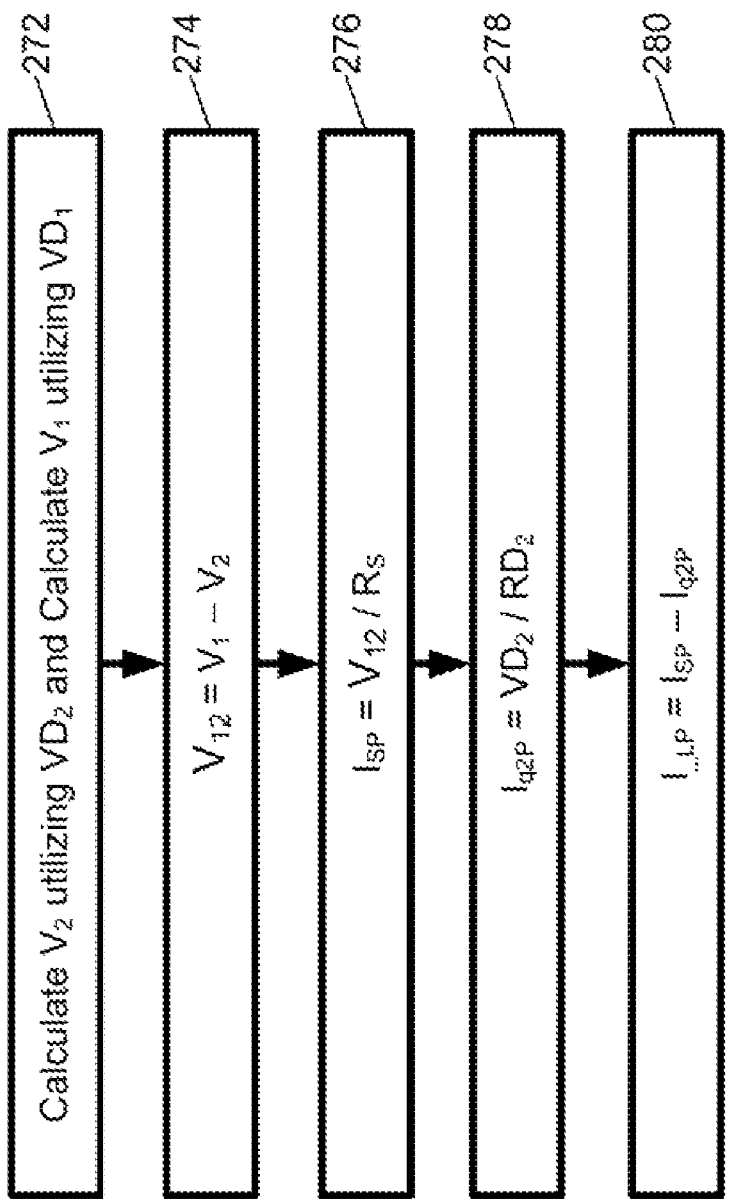
FIG. 2B illustrates a flowchart of a method for obtaining the value/amperage of the positive load current in accordance with one or more embodiments of the present invention.

FIG. 2B illustrates a flowchart of a method for obtaining the value/amperage $I_{LP}$ of positive load current 215 in accordance with one or more embodiments of the present invention. Positive load current 215 may represent the current supplied to the positive terminal of the electrostatic chuck in the plasma processing chamber of the plasma processing system.

Referring to FIG. 2A-B, the process may start with step 272, in which second TIA 208 may measure voltage $VD_2$ across component 209b (with a specified resistance value $RD_2$). Accordingly, voltage $V_2$ at second terminal 252 may be calculated utilizing $VD_2$ and the ratio of the ratio of $RD_1$ to $RD_2$. In the example where $RD_1/RD_2$=600, $V_2$ may be calculated utilizing $V_2$=−$VD_2$*600. $V_2$ may also represent the voltage at the positive terminal (+ESC) of the ESC. $V_2$ may be positive. $V_2$ may also be negative when polarities of the positive terminal and the negative terminals are reversed.

Similarly, TIA 210 may measure $VD_1$ across component 209a. At first terminal 251, voltage $V_1$ (which may represent the value of positive high voltage 299) may be calculated utilizing VD, and the ratio of the ratio of $RD_1$ to $RD_2$. In the example where $RD_1/RD_2$=600, $V_1$ may be calculated utilizing $V_1$=−$VD_1$*600.

In step 274, voltage $V_{12}$ across sensing resistor 250 (with a resistance value $R_S$) between first terminal 251 and second terminal 252 may be determined by subtracting $V_2$ from $V_1$ 229, i.e., $V_{12}$=$V_1$−$V_2$.

In step 276, the current amount/amperage $I_{SP}$ of a current 204 across sensing resistor 250 may be determined with $V_{12}$ divided by $R_S$, i.e., $I_{SP}$=$V_{12}/R_S$.

In step 278, the current amount/amperage $I_{q2P}$ of a current 206 from second terminal 252 to second TIA 208 may be determined with $VD_2$ divided by $RD_2$, i.e., $I_{q2P}$=$VD_2/RD_2$.

In step 280, the current amount/amperage of positive load current 215 may be determined by subtracting $I_{q2P}$ from $I_{SP}$, i.e., $I_{LP}$=$I_{SP}$−$I_{q2P}$.

An arrangement similar to the arrangement illustrated in the example of FIG. 2A may be implemented for obtaining the value of the negative load current associated with negative high voltage 399 in the plasma processing system. A method similar to the method illustrated in the example of FIG. 2B may be implemented for obtaining the value of the negative load current.

FIG. 2C illustrates a mathematical manipulation for obtaining the value/amperage $I_{LP}$ of positive load current 215. As illustrated by equation 241, an intermediate voltage term $V_{ISP}$ may be calculated utilizing the difference between measured $VD_1$ and $VD_2$ and an intermediate term X, i.e., $V_{ISP}$=($VD_1$−$VD_2$)*(−X).

Subsequently, as illustrated by equation 242, ΔV may be calculated utilizing another intermediate term Y, intermediate voltage term $V_{ISP}$, $VD_2$, specified $R_S$, and specified $RD_2$, i.e., ΔV=(Y)*($V_{ISP}$)+($VD_2$)*($R_S/RD_2$).

The values of intermediate terms X and Y may be determined based on the ratio of $RD_1$ to $RD_2$, as well as capability of TIAs and other equipment utilized for measuring voltage values. In particular, the product of intermediate terms X and Y pertain to the ratio of ratio of $RD_1$ to $RD_2$. In the example where $RD_1/RD_2$=600, intermediate term X may be −60, and intermediate term Y may be 10, in one or more embodiments. In one or more embodiments, intermediate term X may be −30, and intermediate term Y may be 20.

As illustrated by equation 243, the value $I_{LP}$ of positive load current 215 may be calculated with ΔV divided by $R_S$, i.e., $I_{LP}$=(ΔV)/($R_S$).

Advantageously, the $RD_1/RD_2$ ratio may be reduced into smaller intermediate terms X and Y, such that the voltage values according to embodiments of the invention may be conveniently measured. For example, the voltage values involved in embodiments of the invention may be tuned to fall within optimal operating ranges of TIAs utilized by adjusting the values of intermediate terms X and Y.

Figure 3:
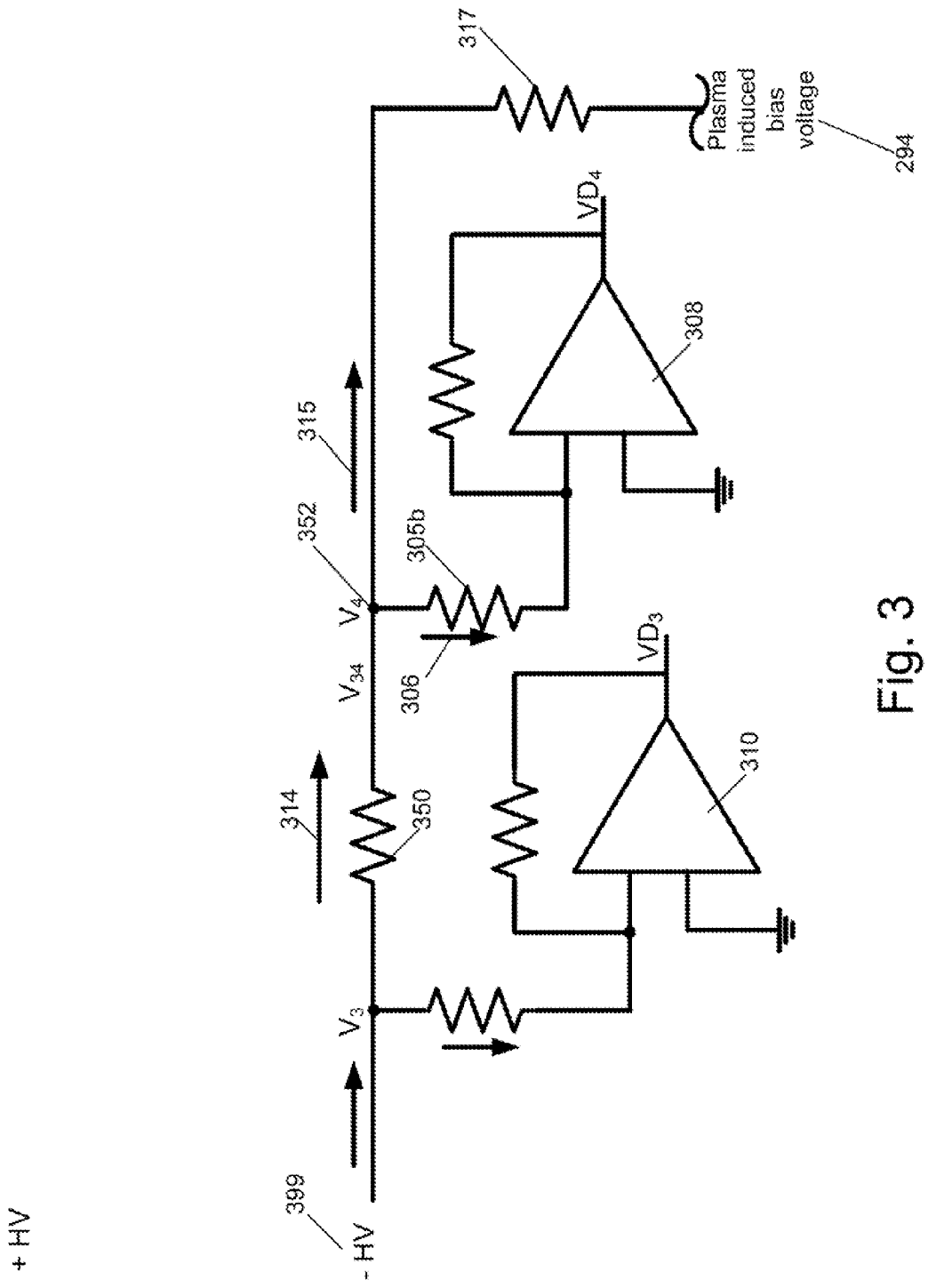
FIG. 3 illustrates a schematic representation of an arrangement for obtaining a value/amperage of a negative load current applied to a negative terminal of the electrostatic chuck in the plasma processing system discussed in the example of FIG. 2A-C in accordance with one or more embodiments of the present invention.

FIG. 3 illustrates a schematic representation of an arrangement for obtaining a value/amperage $I_{LN}$ of a negative load current 315 applied to a negative terminal of the electrostatic chuck in the plasma processing system discussed in the example of FIG. 2A-C in accordance with one or more embodiments of the present invention. The power supply may be configured to supply a negative high voltage 399 to a negative terminal of the electrostatic chuck inside the plasma processing chamber of the plasma processing system through a RF filter. The resistance of the negative terminal and the RF filter may be represented by an equivalent resistor 317.

The plasma processing system may further include a third TIA 310 and a fourth TIA 308 configured to provide measurement of voltages for calculating the value $I_{SN}$ of sensing current 314 across sensing resistance 350. Fourth TIA 308 may also be configured to provide voltage measurement for calculating the value/amperage $I_{q2N}$ of current 306 from a second terminal 352 to fourth TIA 308 across component/resistor 305b. Accordingly, $I_{LN}$ may be calculated utilizing $I_{SN}$ and $I_{q2N}$. The arrangement illustrated in the example of FIG. 3 may be similar to the arrangement illustrated in the example of FIG. 2A, and the methods of utilizing the arrangement illustrated in the example of FIG. 3 may be similar to the methods illustrated in the examples of FIG. 2B-C.

The plasma processing system may further include a clamp control unit. The clamp control unit may be configured to control at least one of a first ESC voltage $V_2$ at the positive terminal (+ESC) and a second ESC voltage $V_4$ at the negative terminal (−ESC) using at least one of $VD_2$ measured by second TIA 208 and $VD_4$ measured by fourth TIA 308. As previously discussed, $V_2$ may be proportional to $VD_2$. Similarly, $V_4$ may be proportional to $VD_4$. In particular, the clamp control unit may control the difference between $V_2$ and $V_4$. The difference between $V_2$ and $V_4$ may also be considered a clamp voltage pertaining to the clamping forces applied to the wafer supported by the ESC.

Figure 4:
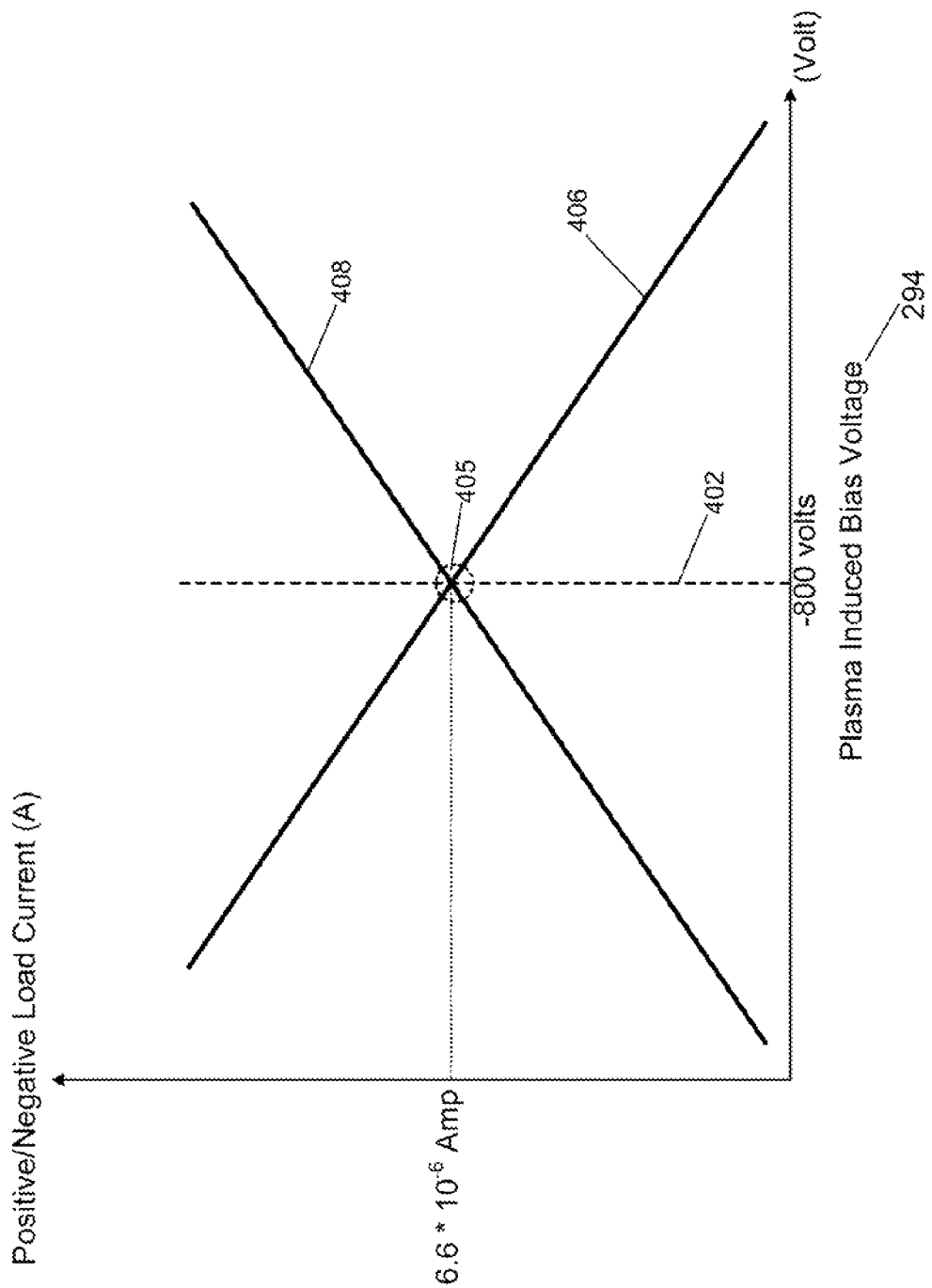
FIG. 4 illustrates a positive load current plot and a negative load current plot for optimizing a bias voltage in the plasma processing system discussed in FIGS. 2A-C and FIG. 3 in accordance with one or more embodiments of the present invention.

FIG. 4 illustrates a positive load current plot 406 and a negative load current plot 408 for optimizing a bias voltage in the plasma processing system discussed in FIGS. 2A-C and 3 in accordance with one or more embodiments of the present invention. As illustrated in the example of FIG. 4, in a plasma processing system, a decrease of plasma induced bias voltage 294 (relative to a bias voltage 402 optimized for securing a wafer on an electrostatic chuck) may correspond to an increase in the positive load current and may correspond to a decrease in the negative load current. The value of the positive load current may be obtained utilizing one or more of the arrangements and/or methods according to one or more embodiments of the present invention as illustrated in the examples of FIGS. 2A-C. The value of the negative load current may be obtained utilizing one or more arrangements and/or methods according to one or more embodiments of the present invention as illustrated in one or more of the example of FIG. 3 and/or similar to one or more arrangements and/or methods illustrated in the examples of FIGS. 2A-C.

In order to stably secure, or "clamp," a wafer on the electrostatic chuck, substantially equal, balanced forces may need to be applied by the positive and negative terminals of the chuck. In order to maintain substantially equal, balanced forces provided by the positive and negative terminals of the chuck, the values of the positive load current and the negative load current may need to be maintained substantially equal.

In one or more embodiments of the invention, bias voltage 402 may be tuned (e.g., programmed and/or configured in a power supply, e.g., utilizing an automatic control program in a control unit similar to bias control or sensor input 198) such that the values of the positive load current and the negative load current may be substantially equal, as illustrated by cross point 405 of positive load current plot 406 and negative load current plot 408 in the example of FIG. 4. In the example of FIG. 4, the value of bias voltage 402 to provide a secure and balanced clamp of the wafer may be around −800 V, which corresponds to amperage of about $6.6*10^{-6}$ A for both the positive load current and the negative load current.

In one or more embodiments, the amperage of the positive load current and/or the negative load current obtained may be utilized in determining the health condition and/or the life expectancy of the electrostatic chuck.

As can be appreciated from the foregoing, embodiments of the invention may provide amperage/values of the positive load current and the negative load current in a plasma processing system without requiring an expensive isolation amplifier. Advantageously, the cost associated with obtaining the values may be reduced.

Further, without depending on an isolation amplifier and instrumentation amplifier, embodiments of the invention may be able to provide values of positive load currents and negative load currents in plasma processing systems that operate at voltage levels that are beyond the capability of a typical isolation amplifier (and a typical instrumentation amplifier, which may only be operable within a limited range, such as −10V~+10V). Utilizing TIAs, high voltages may be scaled down by implementing high resistance between the power supply path and the TIA. Further, intermediate voltage and intermediate terms may be employed to enable measurement to be performed in the optimal ranges of TIAs. Therefore, embodiments of the invention may be especially useful for very high voltage plasma processing systems.

Embodiments of the invention also take into account the current flowing from a terminal on the power supply path to the TIA. Advantageously, embodiments of the invention may provide more accurate values of load currents, thereby providing more accurate control of bias voltage for securing a wafer on an electrostatic chuck. Advantageously, embodiments of the invention may produce higher yield in plasma processing.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section may be provided herein for convenience and, due to word count limitation, may be accordingly written for reading convenience and should not be employed to limit the scope of the claims. It may be therefore intended that the following appended claims be interpreted as including all such alternations, permutations, and equivalents as fall within the true spirit and scope of the present invention.

If a claim is recited without the "means for" language, applicants do not intend for such claim to be construed under 35 USC 112, sixth paragraph. Similarly if a limitation or feature is recited without the "means for" language, applicants do not intend for such limitation or feature to be construed under 35 USC 112, sixth paragraph.

What is claimed is:

1. A plasma processing system for processing a wafer, said plasma processing system comprising:
    an electrostatic chuck (ESC) positioned inside a plasma processing chamber and configured to support said wafer, said ESC including a positive terminal for providing a first force to said wafer and a negative terminal for providing a second force to said wafer;
    a first circuit arrangement configured to measure at least a first voltage for determining a value of a positive load current applied to said positive terminal;
    a second circuit arrangement configured to measure at least a second voltage for determining a value of a negative load current applied to said negative terminal; and
    circuitry configured to adjust a bias voltage using said value of said positive load current and said value of said negative load current for balancing said first force and said second force.

2. The plasma processing system of claim 1 wherein said bias voltage is adjusted to produce an offset between a magnitude of said positive load current and a magnitude of said negative load current, and said offset is used for correcting an error of an estimated plasma induced bias voltage.

3. The plasma processing system of claim 1 further comprising a diagnostic unit configured to determine at least one of a health condition and a remaining life of said ESC based on at least one of said value of said positive load current and said value of said negative load current.

4. The plasma processing system of claim 1 further comprising a control unit configured to control a difference between a first ESC voltage at said positive terminal and a second. ESC voltage at said negative terminal using at least one of a first voltage measured by said first circuit arrangement and a second voltage measured by said second circuit arrangement, said first ESC voltage being proportional to said first voltage, said second ESC voltage being proportional to said second voltage.

5. The plasma processing system of claim 1 wherein said circuitry configured to adjust said bias voltage represents logic circuitry executing a program.

6. The plasma processing system of claim 1 wherein said first circuit arrangement includes at least one trans-impedance amplifier (TIA).

7. The plasma processing system of claim 1 wherein said second circuit arrangement includes at least one trans-impedance amplifier (TIA).

8. The plasma processing system of claim 1 wherein said first circuit arrangement includes at least one trans-impedance amplifier and wherein said second circuit arrangement includes at least another trans-impedance amplifier.

9. A method for securing a wafer on an electrostatic chuck (ESC) inside a plasma processing system, said ESC including a positive terminal for providing a first force to said wafer and a negative terminal for providing a second force to said wafer, said method comprising:
    using a power supply to provide a positive voltage to said positive terminal and to provide a negative voltage to said negative terminal;
    measuring at least a first voltage, using a first circuit arrangement coupled to said positive terminal, for determining a value of a positive load current applied to said positive terminal;
    measuring at least a second voltage, using a second circuit arrangement coupled to said negative terminal, for determining a value of a negative load current applied to said negative terminal; and
    adjusting a bias voltage using said value of said positive load current and said value of said negative load current for balancing said first force and said second force.

10. The method of claim 9 wherein said bias voltage is adjusted to produce an offset between a magnitude of said positive load current and a magnitude of said negative load current, and said offset is used for correcting an error of an estimated plasma induced bias voltage.

11. The method of claim 9 further including determining at least one of a health condition and a remaining life of said ESC based on at least one of said value of said positive load current and said value of said negative load current.

12. The method of claim 9 wherein said adjusting is performed using a program.

13. The method of claim 9 wherein said adjusting is performed using logic circuitry.

14. The method of claim 9 wherein said first circuit arrangement includes at least one trans-impedance amplifier (TIA).

15. The method of claim 9 wherein said second circuit arrangement includes at least one trans-impedance amplifier (TIA).

16. The method of claim 9 wherein said first circuit arrangement includes at least one trans-impedance amplifier and wherein said second circuit arrangement includes at least another trans-impedance amplifier.

17. A plasma processing system for processing a wafer, said plasma processing system comprising:
   an electrostatic chuck (ESC) positioned inside a plasma processing chamber and configured to support said wafer, said ESC including a positive terminal for providing a first force to said wafer and a negative terminal for providing a second force to said wafer;
   means configured to measure at least a first voltage for determining a value of a positive load current applied to said positive terminal;
   means configured to measure at least a second voltage for determining a value of a negative load current applied to said negative terminal; and
   means for adjusting a bias voltage using said value of said positive load current and said value of said negative load current for balancing said first force and said second force.

18. The plasma processing system of claim 17 wherein said bias voltage is adjusted to produce an offset between a magnitude of said positive load current and a magnitude of said negative load current, and said offset is used for correcting an error of an estimated plasma induced bias voltage.

19. The plasma processing system of claim 17 further comprising a diagnostic unit configured to determine at least one of a health condition and a remaining life of said ESC based on at least one of said value of said positive load current and said value of said negative load current.

20. The plasma processing system of claim 17 further comprising means for controlling a difference between a first ESC voltage at said positive terminal and a second ESC voltage at said negative terminal using at least one of a first voltage measured by said first circuit arrangement and a second voltage measured by said second circuit arrangement, said first ESC voltage being proportional to said first voltage, said second ESC voltage being proportional to said second voltage.

* * * * *